United States Patent [19]
Chwa et al.

[11] Patent Number: 6,147,008
[45] Date of Patent: Nov. 14, 2000

[54] CREATION OF MULTIPLE GATE OXIDE WITH HIGH THICKNESS RATIO IN FLASH MEMORY PROCESS

[75] Inventors: Siow Lee Chwa; Ying Jin; Yung-Tao Lin, all of Singapore, Singapore

[73] Assignee: Chartered Semiconductor Manufacturing Ltd., Singapore, Singapore

[21] Appl. No.: 09/443,421

[22] Filed: Nov. 19, 1999

[51] Int. Cl.[7] .................................................. H01L 21/31
[52] U.S. Cl. ........................... 438/762; 438/770; 438/981
[58] Field of Search .................... 438/981, 264, 438/762, 770

[56] References Cited

U.S. PATENT DOCUMENTS

| | | | |
|---|---|---|---|
| 5,316,981 | 5/1994 | Gardner et al. | |
| 5,330,920 | 7/1994 | Soleimani et al. | |
| 5,362,685 | 11/1994 | Gardner et al. | |
| 5,480,828 | 1/1996 | Hsu et al. | |
| 5,502,009 | 3/1996 | Lin | |
| 5,637,520 | 6/1997 | Cappelletti et al. | 438/258 |
| 5,668,035 | 9/1997 | Fang et al. | 438/239 |
| 5,672,521 | 9/1997 | Barsan et al. | |
| 5,866,445 | 2/1999 | Baumann | 438/199 |
| 5,918,116 | 6/1999 | Chittipeddi | 438/199 |
| 5,937,310 | 8/1999 | Gardner et al. | 438/440 |
| 5,970,345 | 10/1999 | Hattangady et al. | 438/279 |

*Primary Examiner*—Richard Booth
*Attorney, Agent, or Firm*—George O. Saile; Rosemary L. S. Pike

[57] ABSTRACT

A new method is provided for the creation of an oxide layer that contains three different thicknesses. A first layer of oxide is grown on the surface of a substrate; a first layer of photoresist is deposited and patterned thereby partially exposing the surface of the underlying first layer of oxide. A nitrogen implant is performed into the surface of the underlying substrate; the photoresist mask of the first layer of photoresist is removed. A second layer of photoresist is deposited and patterned, the first layer of oxide is removed from above and surrounding the implanted regions of the substrate. The second mask of resist is removed. The first layer of oxide is reduced in thickness, its thickness is restored to a first thickness by a blanket growth of a second layer of oxide over the exposed surface of the substrate (where no ion implant has been performed) to a third thickness, over the surface of the substrate where the ion implant has been performed to a second thickness and over the surface of the first layer of oxide thereby restoring this layer of oxide to its original first thickness.

11 Claims, 2 Drawing Sheets

CREATION OF MULTIPLE GATE OXIDE WITH HIGH THICKNESS RATIO IN FLASH MEMORY PROCESS

BACKGROUND OF THE INVENTION (1) Field of the Invention

The invention relates to the fabrication of integrated circuit devices, and more particularly, to a method for creating low and high voltage flash memory devices.

(2) Description of the Prior Art

Developments in the semiconductor industry have over the years focused on a wide array of technical disciplines, device designs and device packaging approaches. Improved semiconductor performance can be obtained following one or more of these avenues. Where a large number of semiconductor improvements have been obtained by device miniaturization, other approaches have sought to improve device performance by creating multifunction devices on one semiconductor die. Historically, semiconductor devices have been broadly divided in functions of data manipulation (logic devices) or data storage (memory devices). Devices that address these two different data processing functions have also historically been stored on different physical devices. Where however memory cells are created on a device that mostly functions as a data storage and data retrieval device, the actual memory cells within the device are typically surrounded by peripheral functions such as address decoders, read/write buffers and sense amplifiers.

The creation of many semiconductor devices starts with the growing of a layer of gate oxide over the surface where the device is to be located. The gate oxide is a thin thermal oxide, which allows better adhesion between the overlying layers (for instance nitride) and the (underlying) silicon and acts as a stress relaxation layer during field oxidation. Gate oxide can be formed by thermal oxidation of the underlying silicon and can also be formed in conjunction with a deposited oxide layer, nitride layer or any other material suitable for use as a gate dielectric. Gate oxide is usually formed as a silicon dioxide material but may be a composite oxide, such as TEOS and silicon dioxide, or a nitride oxide layer or a like gate dielectric. A gate oxide layer can for instance be grown in an oxidation steam ambient at a temperature between about 850 and 1000 degrees C. to a thickness between about 50 and 250 Angstrom.

Device performance is highly dependent on the thickness of the layer of gate oxide. In devices that combine FET devices with surrounding logic devices, the combined function that is provided by one semiconductor device requires the deposition of gate oxide layers of different thickness. Typically, surrounding logic functions required the use of a thin layer of gate oxide to enhance overall device performance while a thicker gate oxide is required in view of the required higher gate voltage for the FET access transistor of DRAM cells. As an example, with a voltage bias of about 2 volts of the substrate on which a FET memory device is created, a voltage difference of about 5 volts is required between the gate electrode and the substrate resulting in a gate voltage of 7 volts for the FET access transistor of the memory cells. The FET's of the logic portion of the circuit however require a gate voltage of about 3.3 volts, making it clear that layers of pad oxide are required for these devices that are of different thickness.

Another application where gate oxide layers of different thickness is required is in the application of MOS devices where combined PMOS and NMOS devices are created that form a converter. The majority carriers of PMOS devices are holes; the majority carriers of NMOS devices are electrons. Holes have a considerable lower mobility than electrons resulting in a lower drive capability of the PMOS device To compensate for this and to equalize the drive capability of the two types of devices, either the gate of the PMOS device is widened (allowing more drive current for a given gate voltage) or the thickness of the gate oxide layers for the two types of devices is adjusted allowing for higher gate current while maintaining gate width the same. Of these two solutions, the varying of the thickness of the gate oxide is the more promising since the widening of the gate electrode requires surface area, which is contrary to the desire of miniaturization of the devices. One of the techniques (provided by U.S. Pat. No. 5,330,920) that can be used to create gate oxide layers of different thickness is by selective ion implanting of a sacrificial layer of oxide that has been created over the surface of the substrate. The layer of gate oxide that is created over the surface that has been ion implanted is thinner that the gate oxide that is created over the surface that has not been subjected to ion implantation.

It is clear that the combination of providing different functions within the design of one semiconductor device brings with it the requirement for different thickness of the gate oxide layer. Typically, high voltage devices such as program and erase transistors require a relative thick layer of gate oxide that protects the device against high voltage breakdown. Where however device speed is important, a thin layer of oxide is required, operating speed is enhanced with a thin layer of oxide combined with a narrow gate structure (short channel length). These latter requirements gain further importance where devices with micron or sub-micron device features are implemented.

Layers of tunnel oxide are created under the floating gates of flash memory EEPROM devices. Data retention requirements of the EEPROM devices require that these layers of tunnel oxide have at least a minimum thickness, a requirement that may conflict with requirements of other oxide layer thickness of devices that are also contained within the EEPROM device. For non-volatile memory devices, this leads to the need for layers of oxide that have three different thicknesses. The data entry and erase transistors typically require (high date retention which means) relatively thick layers of pad oxide, the surrounding logic functions require (high operating speed which means) relatively thin layers of oxide and a thickness for the layer of tunnel oxide that is determined by requirements of device reliability.

Prior Art methods of forming oxide layers of different thickness use multiple steps of masking and oxide etch. The first layer created in this manner, typically the thickest layer, is initially grown on the surface of the substrate. This layer is masked with a layer of photoresist and etched thereby removing the unmasked layer of oxide from the substrate. The mask of photoresist is removed; a second layer of oxide is then grown over the surface of the substrate including the remaining first layer of oxide. This process results in a layer of oxide that has two thickness levels. This process can be repeated for the application where more than two levels of thickness are required, using a sequence of steps of deposition and etch. This process however suffers from the disadvantage of many sequential processing steps while the repeated use of photoresist, which is not easy to completely remove, results in layers of oxide of poor quality. Partial etch back of a deposited layer of oxide cab also be used but this method too suffers from the same disadvantages.

U.S. Pat. No. 5,672,521 (Barsan et al.) discloses I/I N2, an N-type ion I/I and uses a masking/oxide etch back to create 3 gate oxide thicknesses in different areas. This is very close to the invention.

U.S. Pat. No. 5,866,445 (Baumann) shows a N2 I/I to retard gate oxide thicknesses. See col.2, lines 57 to 67. Baumann does not show the invention's masking/oxide etch back step, but this may be considered obvious in combination with other patents. This is close to the invention.

U.S. Pat. No. 5,330,920 (Soleimani et al.) shows a dual gate oxide method using a N2 I/I.

U.S. Pat. No. 5,918,116 (Chittipedde) shows a process to form different gate oxide thicknesses by an amorphizing I/I.

U.S. Pat. No. 5,668,035 (Fang et al.) disclose dual gate oxide thickness by a masking/oxide step.

SUMMARY OF THE INVENTION

A principle objective of the invention is to provide a method of forming a layer of oxide that has a non-uniform thickness.

Another objective of the invention is to provide a method of forming oxide layers that allows for the creation of flash memory cells that can be used in different voltage applications.

In accordance with the objectives of the invention a new method is provided for the creation of an oxide layer that contains three different thicknesses. A first layer of oxide is grown on the surface of a substrate to a first thickness; this layer of oxide partially serves as the layer that has the largest thickness. This layer is also used as a screening oxide during a subsequent step of nitrogen implant. A first layer of photoresist is deposited on the surface of the first layer of oxide, the first layer of resist is patterned thereby partially exposing the surface of the underlying first layer of oxide. A nitrogen implant is performed into the underlying substrate through the partially exposed surface of the underlying first layer of oxide. The photoresist mask of the first layer of photoresist is removed. A second layer of photoresist is deposited on the surface of the first layer of oxide, the second layer of photoresist is patterned thereby partially exposing the surface of the underlying first layer of oxide, the exposed surface of the first layer of oxide aligns with the region of the underlying substrate where the ion implant was performed. The first layer of oxide is removed from above the implanted regions of the substrate thereby exposing the surface of the substrate above the regions that contains the ion implant. The second mask of resist is removed. The first layer of oxide is reduced in thickness, but its thickness is restored to a first thickness by a deposition of a second layer of oxide that is blanket deposited over the exposed surface of the substrate (where no ion implant has been performed) to a third thickness, over the surface of the substrate where the ion implant has been performed to a second thickness and over the surface of the first layer of oxide thereby restoring this layer of oxide to its original first thickness.

DESCRIPTION OF THE PREFERRED EMBODIMENT

Current flash memory design offers only a single voltage application, that is 2.5 volts. New and expanded applications of the flash memory devices require that this limitation be removed for the design of dual voltage applications, specifically 2.5 volts and 3.3 volts applications. To provide for dual voltage applications, it is required that a method is provided that can create oxide layers of three different thicknesses. The triple gate oxide thickness of the invention is created for application to 2.5/3.5 volts flash memory devices. The process of the invention provides two thin layers of oxide (43 and 65 Angstrom thick) in addition to a thick layer of oxide (200 Angstrom) that is required for high voltage applications. The current process of creating oxide layers for flash memories is, under the invention, expanded to include a nitrogen ion implant and one additional reticle and masking step. The extra masking step is required to specify the region where the nitrogen implant will be performed in the surface underlying the to be created layer of oxide, this implant retards the formation of oxide over the surface where the implant has been performed. The latter regions will therefore have the thinnest layer of oxide overlying it.

Figure 1:
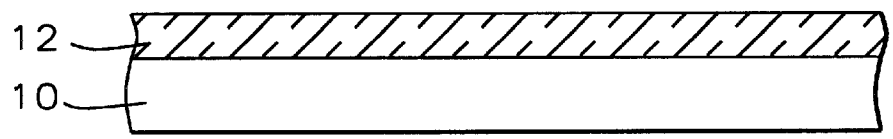
FIG. 1 shows a cross section of a first layer of oxide that has been deposited over an underlying semiconductor surface to a first thickness.

Referring now specifically to FIG. 1, there is shown a cross section of a first layer 12 of oxide that has been deposited over an underlying semiconductor surface 10 to a first thickness.

Surface 10 is preferably the surface of a monocrystalline silicon substrate preferably having a crystalline orientation of <100>. The layer 12 of oxide is deposited on the bare silicon after the silicon surface has been cleaned. The layer 12 typically consists of $SiO_2$ and can be thermally grown on the surface of the wafer. The purpose of this layer is to serve as a cushion the transition of the stress between the silicon substrate and overlying depositions. In general, the thicker the layer of pad oxide, the less edge force is being transmitted from the overlying depositions to the silicon. Typically, a blanket pad oxide can be formed to a thickness of about 110 Angstrom through a thermal oxidation method at a temperature of about 920 degrees C. for a time period of about 480 seconds. The preferred thickness of the layer 12 of the invention is 200 Angstrom. By raising the temperature to between about 700 to 1100 degrees C. while subjecting the surface of said silicon substrate to oxidation in a dry $O_2$ environment, the time of oxidation can be reduced to between about 4 and 25 minutes.

Figure 2:
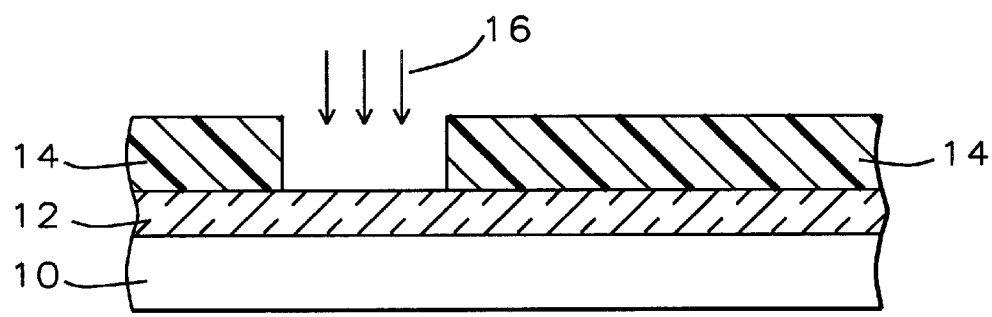
FIG. 2 shows a cross section after a first layer of photoresist has been deposited and patterned and while on ion implant is being performed into the underlying layer.

FIG. 2 shows a cross section after a first layer 14 of photoresist has been deposited and patterned and while an ion implant 16 is being performed into the underlying layer 10. The layer 14 of photoresist can be deposited to a thickness of about 10,000 Angstrom and needs to be thick enough so that this layer serves as an effective shield during the ion implant 16. Deposition and patterning of the layer 14 of photoresist uses conventional methods of photoresist deposition and photolithographic masking that are well known in the art.

The ion implant 16 is to strike and penetrate the underlying surface 10 over a well-defined region. The preferred parameters of implant 16 of the invention are using nitrogen ions as a source implanted with an energy of about 10 to 50 KeV and a dose of about 10E14 atoms/cm$^2$.

Figure 3:
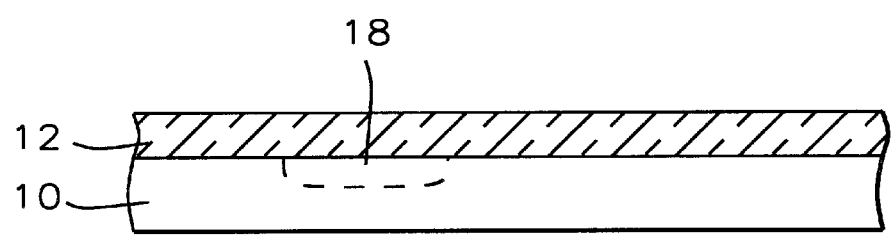
FIG. 3 shows a cross section of the first layer of oxide after the ion implant has penetrated the underlying layer.

FIG. 3 shows a cross section of the first layer of oxide 12 after the ion implant 16 has penetrated the underlying layer thereby forming a region 18 of heavy concentration of nitrogen ions in the surface of surface 10. This nitrogen concentration has the width of the opening that has been etched in the overlying layer of photoresist (14, FIG. 2). The depth of the nitrogen ion penetration into the surface of layer 10 can be controlled by adjusting the energy that is used to perform the implant 16. The typical depth of penetration is between about 50 and 100 Angstrom. By increasing the density of the nitrogen ion implant, the density of the nitrogen ions that are implanted in regions 18 can be controlled. This is a parameter of choice in determining the thickness of the overlying layer of oxide that is to be created on the surface of layer 10 as will subsequently become apparent.

Figure 4:
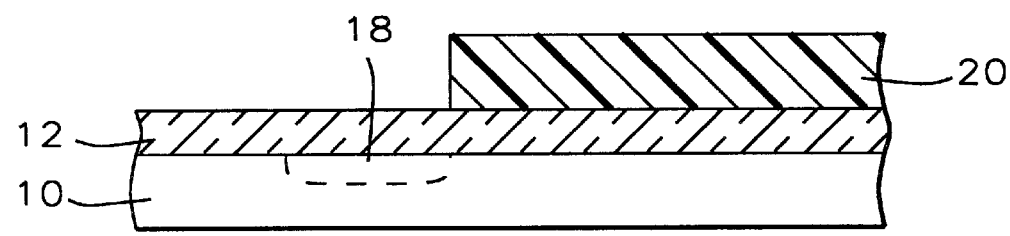
FIG. 4 shows a cross section after a second layer of photoresist has been deposited and patterned over the surface of the first layer of oxide.

FIG. 4 shows a cross section after a second layer 20 of photoresist has been deposited and patterned over the surface of the first layer of oxide. The layer 20 of photoresist can be deposited to a thickness of about 10,000 Angstrom and serves as a mask for a subsequent step of etch of the underlying first layer 12 of oxide. Deposition and patterning of the layer 20 of photoresist uses conventional methods of photoresist deposition and photolithographic masking that are well known in the art. It must be noted that the layer 20 of photoresist is removed from above the surface of layer 10 where the nitrogen ion implant has been made and from the area immediately adjacent to the ion implant area. The surface area of the surface 10 over which the layer 20 of photoresist has been removed is the surface where oxide will be deposited that has various thicknesses.

Figure 5:
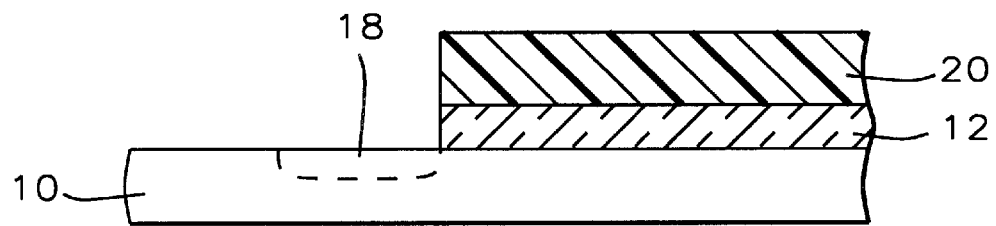
FIG. 5 shows a cross section after the first layer of oxide has been partially stripped from the surface of the underlying surface.

FIG. 5 shows a cross section after the first layer 12 of oxide has been partially stripped from the surface of the underlying surface 10. Layer 12 of oxide can be wet etched using a buffered oxide etchant (BOE). The BOE may comprise a mixed solution of fluoroammonium and fluorohydrogen (7:1) and phospheric acid solution. The oxide layer 14 can also be dipped into hydrogen fluoride (HF) to be removed.

It must be noted that the surface of the surface 10 is exposed over an area that includes the area 18 where the ion implant has been performed. This is important to note since this area has, due to the presence 18 of the nitrogen ions in the surface regions of substrate 10, a crystalline composition that is different from the surface regions where no nitrogen ions have been implanted.

The crystalline composition of the substrate 10 that contains the nitrogen ions 18 is not the same as that of the substrate 10 that does not contain nitrogen ions. This difference is of importance to the process of the invention because it is this difference that causes oxidation of the surface to result in different thicknesses of the oxide layer that is grown.

Figure 6:
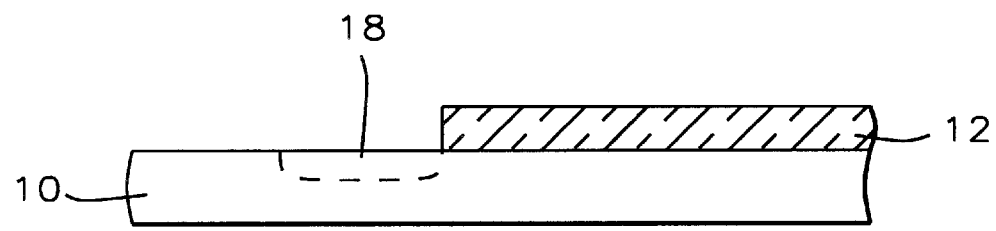
FIG. 6 shows a cross section after the etch mask that is formed by the patterned second layer of photoresist is removed.

FIG. 6 shows a cross section after the etch mask 20 that was formed by the patterned second layer of photoresist is removed. The thickness of the first layer 12 has also been reduced, in the example shown this reduction has been a reduction of 20 Angstrom of the original thickness of 200 Angstrom bringing the thickness of the first layer 12 of oxide that is shown in FIG. 6 down the 180 Angstrom. The amount of the reduction in the thickness of layer 2 is determined by requirements of the thickness of the three layers that are to be created. In this case, it is estimated that the thickness of the layer of oxide is 200 Angstrom, this combined with the thickness requirements of the other two thickness parameters of the final layer of oxide imposes the requirement that the first layer of oxide at this time must be reduced by 20 Angstrom as indicated.

Figure 7:
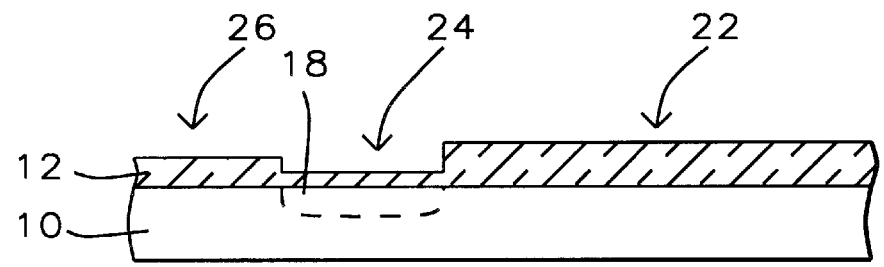
FIG. 7 shows a cross section after a second layer of oxide has been blanket deposited thereby creating a layer of oxide over the underlying surface of three levels of thickness.

FIG. 7 shows a cross section after a second layer of oxide (not shown) has been grown thereby creating a layer of oxide over the underlying surface of three levels of thickness. The second layer of oxide that has been grown has a thickness of about 65 Angstrom; this results in three different thickness of the final layer 12 of oxide, as follows:

the first thickness of layer 12, that is the thickness of the original layer 12 of oxide that has now been restored to its original value of 200 Angstrom the second thickness of layer 12, that is the thickness of the oxide region 26 which is the thickness of the grown second layer of oxide, that is 65 Angstrom, and the third thickness of layer 12, that is the thickness of the oxide region 24 that is less than the thickness of the grown second layer of oxide. The reason for this reduction in thickness in the presence of the concentration 18 of nitrogen ion which results, as indicated above, in a unique crystalline composition near the surface of region 18. This in turn results in different thickness of the grown oxide above the region 18 as compared with adjacent regions of the surface of substrate 18.

It is clear that the process of the invention lends itself to considerable expansion from the specifics that have been highlighted in FIGS. 1 through 7. For instance, by using materials other than nitrogen for the source of implant and by varying the dose and the energy of the implant process, the thicknesses of the grown layer of oxide can be made to vary considerably.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What claimed is:

1. A method of controlling gate oxide thickness in the fabrication of semiconductor devices, comprising the steps of:

providing a semiconductor substrate;

forming a layer of sacrificial oxide on the surface of said semiconductor substrate;

depositing a first layer over the surface of said layer of sacrificial oxide;

patterning and etching said first layer thereby creating an opening in said first layer said opening to extend to the surface of said layer of sacrificial oxide;

performing an ion implant into the surface of said semiconductor substrate whereby said ion implant aligns with said opening in said first layer;

removing said first layer from the surface of said layer of sacrificial oxide;

depositing a second layer over the surface of said layer of sacrificial oxide;

patterning and etching said second layer thereby creating an opening in said second layer said opening to include and expand beyond the area of said sacrificial oxide that overlies said ion implant;

removing said sacrificial oxide from the surface of said semiconductor substrate in accordance with said opening in said second layer thereby creating a patterned layer of sacrificial oxide thereby furthermore exposing the surface of said substrate underneath said opening;

removing said second layer from the surface of said layer of sacrificial oxide thereby exposing the surface of said patterned layer of sacrificial oxide;

reducing the thickness of said patterned layer of sacrificial oxide a measurable amount; and blanket growing a second layer of oxide over said patterned layer of sacrificial oxide thereby including said exposed surface of said substrate.

2. The method of claim 1 wherein said semiconductor substrate is silicon.

3. The method of claim 1 wherein said depositing a first layer is depositing a layer of photoresist or passivation or dielectric or insulation to a thickness of about 10,000 Angstrom or any thickness that stops the implanting of particular ions into the surface of the substrate that is covered with said first layer.

4. The method of claim 1 wherein said depositing a second layer is depositing a layer of photoresist or a layer of passivation or a layer of dielectric or a layer of insulation.

5. The method of claim 1 wherein said performing an ion implant into the surface of said semiconductor substrate is implanting nitrogen ions at a dose of between about $10^{12}$ and $10^{16}$ ions per cm$^2$ with an energy of between about 10 and 50 KeV.

6. The method of claim 1 with the additional step of annealing said sacrificial layer of oxide at a temperature between about 700 and 1200 degrees C. for a time between about 1 and 90 minutes said additional step to be performed after said step of forming a layer of sacrificial oxide.

7. The method of claim 1 wherein said gate oxide layer is thermally formed by subjecting the surface of said silicon substrate to oxidation in a dry $O_2$ environment at a temperature between about 700 to 1100 degrees C. for a time between about 4 and 25 minutes.

8. A method of controlling gate oxide thickness in the fabrication of semiconductor devices, comprising the steps of:

providing a silicon semiconductor substrate;

forming a layer of sacrificial oxide on the surface of said semiconductor substrate;

depositing a first layer over the surface of said layer of sacrificial oxide to a thickness of about 10,000 Angstrom or any thickness of said first layer that stops the implanting of particular ions into the surface of the substrate that is covered with said first layer;

patterning said first layer thereby creating an opening in said first layer said opening to extend to the surface of said layer of sacrificial oxide;

performing a nitrogen ion implant into the surface of said semiconductor with a dose of between about $10^{12}$ and $10^{16}$ ions per cm$^2$ with an energy of between about 10 and 50 KeV into said substrate whereby said ion implant aligns with said opening in said first layer;

removing said first layer from the surface of said layer of sacrificial oxide;

depositing a second layer over the surface of said layer of sacrificial oxide;

patterning said second layer thereby removing said second layer from the surface of said sacrificial oxide over a measurable area said measurable area to include and expand beyond the area of said sacrificial oxide that overlies said ion implant;

removing said sacrificial oxide from the surface of said semiconductor substrate in accordance with said measurable area over which said second layer has been removed thereby creating a patterned layer of sacrificial oxide thereby furthermore exposing the surface of said substrate underneath said measurable area of said sacrificial oxide;

removing said second layer thereby exposing the surface of said patterned layer of sacrificial oxide;

reducing the thickness of said patterned layer of sacrificial oxide by a measurable amount; and growing a second layer of oxide to a thickness of about 65 Angstrom over said patterned layer of sacrificial oxide thereby including said exposed surface of said substrate.

9. The method of claim 8 with the additional step of annealing said sacrificial layer of oxide at a temperature between about 700 and 1200 degrees C. for a time between about 1 and 90 minutes said additional step to be performed after said step of forming a layer of sacrificial oxide.

10. The method of claim 8 wherein said depositing a first layer is depositing a layer of photoresist or passivation or dielectric or insulation to a thickness of about 10,000 Angstrom or any suitable thickness that stops the implanting of particular ions into the surface of the substrate that is covered with said first layer.

11. The method of claim 8 wherein said depositing a second layer is depositing a layer of photoresist or a layer of passivation or a layer of dielectric or a layer of insulation.

* * * * *